US009479166B1

(12) United States Patent
Jeon (10) Patent No.: US 9,479,166 B1
(45) Date of Patent: Oct. 25, 2016

(54) SEMICONDUCTOR DEVICES AND INTEGRATED CIRCUITS

(71) Applicant: SK hynix Inc., Icheon-si, Gyeonggi-do (KR)

(72) Inventor: Byung Deuk Jeon, Seongnam-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/972,498

(22) Filed: Dec. 17, 2015

(30) Foreign Application Priority Data

Sep. 8, 2015 (KR) .................. 10-2015-0127108

(51) Int. Cl.
H03K 17/16 (2006.01)
H03K 19/00 (2006.01)

(52) U.S. Cl.
CPC .................. H03K 19/0005 (2013.01)

(58) Field of Classification Search
CPC ............... H03K 19/0005; H03K 19/017545; G11C 2207/2254
USPC ........................................................ 326/30
See application file for complete search history.

(56) References Cited

U.S. PATENT DOCUMENTS

| 8,536,894 B1 * | 9/2013 | Tan ................ H03K 19/018528 326/30 |
| 2007/0126466 A1 * | 6/2007 | Kim ...................... G11C 29/02 326/30 |
| 2008/0054935 A1 * | 3/2008 | Pan .................... H03K 19/0005 326/30 |
| 2010/0000175 A1 * | 1/2010 | Johnson .............. B28B 23/0056 52/704 |
| 2012/0056641 A1 * | 3/2012 | Kuroki ........... H03K 19/017545 326/30 |
| 2013/0015879 A1 * | 1/2013 | Araki ............... H03K 19/00369 326/30 |
| 2013/0214812 A1 * | 8/2013 | Koo ............... H03K 19/018571 326/30 |
| 2014/0002130 A1 * | 1/2014 | Jang ....................... H03K 17/16 326/30 |
| 2015/0042379 A1 | 2/2015 | Hara |

FOREIGN PATENT DOCUMENTS

KR 1020140080947 A 7/2014

* cited by examiner

Primary Examiner — Don Le
(74) Attorney, Agent, or Firm — William Park & Associates Ltd.

(57) ABSTRACT

A data transmission circuit may include first, second, and third pads, generate a pull-up code and a pull-down code in accordance with a resistance value between the third pad and a ground terminal, and drive data with drivability adjustable by the pull-up code and the pull-down code to output the data. The data reception circuit may include a resistor coupling circuit coupled between the first pad and the second pad to include a second resistance value, include an external resistor coupled to the third pad through a first wiring resistor having a first resistance value, and receive the data through a second wiring resistor.

30 Claims, 6 Drawing Sheets

SEMICONDUCTOR DEVICES AND INTEGRATED CIRCUITS

CROSS-REFERENCE TO RELATED APPLICATIONS

The present application claims priority under 35 U.S.C 119(a) to Korean Patent Application No. 10-2015-0127108, filed on Sep. 8, 2015, in the Korean Intellectual Property Office, which is incorporated herein by reference in its entirety as set forth in full.

BACKGROUND

1. Technical Field

Embodiments of the present disclosure generally relate to semiconductor devices having an impedance calibration function and integrated circuits including the same.

2. Related Art

In recent years, fast semiconductor systems have been increasingly in demand. Accordingly, timing margins between internal signals used in the semiconductor systems have been reduced. A threshold voltage and a turn-on current of NMOS transistors or PMOS transistors included in the semiconductor system may change depending on process conditions for fabricating the semiconductor system, and variation of the threshold voltage and the turn-on current of the NMOS transistors or the PMOS transistors may affect a skew of the internal signals used in the semiconductor system. If the timing margin between the internal signals is reduced due to a variation of the skew, the semiconductor system may malfunction.

As a level swing width of a transmission signal corresponding to an interface signal between semiconductor devices included in the semiconductor system operating at a high speed is gradually reduced, reflection of the transmission signal due to impedance mismatch of an interface unit may be raised as a serious issue. The impedance mismatch may occur due to variation of process conditions. Thus, the semiconductor system employs an impedance matching circuit such as an on-die termination (ODT) circuit.

Impedance calibration (ZQ calibration) may mean generation of codes for adjusting a resistance value of the ODT circuit, which varies according to a process condition. The ODT circuit having a resistance value adjustable by the impedance calibration may remove the impedance mismatch of the interface unit to prevent distortion of the transmission signal.

DETAILED DESCRIPTION

Various embodiments may be directed to semiconductor devices having an impedance calibration function and integrated circuits including the same.

According to an embodiment, an integrated circuit may include a data transmission circuit and a data reception circuit. The data transmission circuit may include first, second, and third pads, generate a pull-up code and a pull-down code in accordance with a resistance value between the third pad and a ground terminal, and drive data with drivability adjustable by the pull-up code and the pull-down code to output the data. The data reception circuit may include a resistor coupling circuit coupled between the first pad and the second pad to include a second resistance value, include an external resistor coupled to the third pad through a first wiring resistor having a first resistance value, and receive the data through a second wiring resistor.

According to an embodiment, a semiconductor device may include a calibration circuit, a resistor coupling circuit, and a data output circuit. The calibration circuit may include first to third pads and may perform an impedance calibration operation in accordance with a resistance value between the third pad coupled to an external resistor and a ground terminal to generate a pull-up code and a pull-down code. The resistor coupling circuit may be coupled between the first pad and the second pad to have a second resistance value. The data output circuit may drive data with a drivability adjusted by the pull-up code and the pull-down code to output the data through a first wiring resistor having a first resistance value.

According to an embodiment, a semiconductor device may be provided. The semiconductor device may include a calibration circuit including a first pad and configured to perform an impedance calibration operation in accordance with a resistance value between the first pad coupled to an external resistor and a ground terminal. The semiconductor device may include a data output circuit coupled to the calibration circuit and configured to output data, drive the data, and adjust driving the data in accordance with a resistance value of the external resistor.

Various embodiments of the present disclosure will be described hereinafter with reference to the accompanying drawings. However, the embodiments described herein are for illustrative purposes only and are not intended to limit the scope of the present disclosure.

Figure 1:
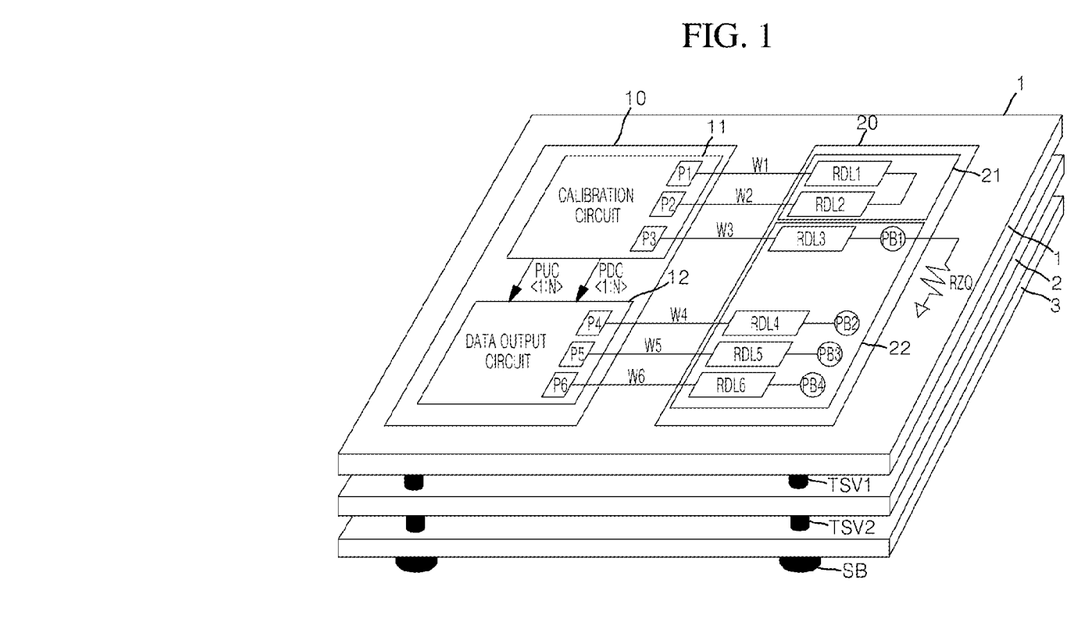
FIG. 1 is a schematic view illustrating a representation of an example of a configuration of an integrated circuit according to an embodiment of the present disclosure.

Referring to FIG. 1, an integrated circuit according to an embodiment of the present disclosure may include a first semiconductor device 1, a second semiconductor device 2, and a third semiconductor device 3. The first semiconductor device 1 may include a data transmission circuit 10 and a data reception circuit 20.

The data transmission circuit 10 may include a calibration circuit 11 and a data output circuit 12.

The calibration circuit 11 may include first to third pads P1 to P3 and may perform an impedance calibration operation according to a resistance value of the third pad P3 to generate a pull-up code PUC<1:N> and a pull-down code PDC<1:N>. The number of pads included in the calibration circuit 11 may be set differently in accordance with the embodiments. The first to third pads P1 to P3 may be coupled to other devices through first to third wires W1 to W3. The first to third pads P1 to P3 may be realized using general pads for inputting or outputting data and signals used in a general semiconductor device.

The data output circuit 12 may include fourth to sixth pads P4 to P6 and may drive data using a drivability adjusted by the pull-up code PUC<1:N> and the pull-down code PDC<1:N> to output the data through the fourth to sixth pads P4 to P6. The number of pads included in the data output circuit 12 may be set differently in accordance with the embodiments. The fourth to sixth pads P4 to P6 may be coupled to other devices through fourth to sixth wires W4 to W6. The fourth to sixth pads P4 to P6 may be realized using general pads for inputting and outputting data and signals used in a general semiconductor device.

For example, the data transmission circuit 10 may include the first to third pads P1 to P3, may generate the pull-up code PUC<1:N> and the pull-down code PDC<1:N> in accordance with the resistance value of the third pad P3, and may drive the data using the drivability adjusted by the pull-up code PUC<1:N> and the pull-down code PDC<1:N> to output the data through the fourth to sixth pads P4 to P6. The resistance value of the third pad P3 will be described later. An operation of adjusting drivability for driving the data may include controlling an internal resistance value using the pull-up code PUC<1:N> and the pull-down code PDC<1:N> and driving the data in accordance with the adjusted internal resistance value.

The data reception circuit 20 may include a resistor coupling circuit 21, a bump pad coupling circuit 22, and an external resistor RZQ.

The resistor coupling circuit 21 may include first and second wiring resistors RDL1 and RDL2 coupled in series between the first pad P1 and the second pad P2.

A connection relationship of the first and second wiring resistors RDL1 and RDL2 will be described hereinafter.

The first wiring resistor RDL1 may have a first resistance value R1 and may be coupled to the first pad P1 through the first wire W1.

The second wiring resistor RDL2 may have the first resistance value R1. One terminal the second wiring resistor RDL2 may be coupled to the first wiring resistor RDL1, and the other terminal of the second wiring resistor RDL2 may be coupled to the second pad P2 through the second wire W2.

For example, the resistor coupling circuit 21 may be realized by coupling in series the first wiring resistor RDL1 and the second wiring resistor RDL2 between the first pad P1 and the second pad P2. A resistance value of the resistor coupling circuit 21 may be set to a second resistance value R2 corresponding to a sum of the resistance values of the first wiring resistor RDL1 and the second wiring resistor RDL2. The second resistance value R2 may be set to be twice that of the first resistance value R1.

The bump pad coupling circuit 22 may include third to sixth wiring resistors RDL3 to RDL6 and first to fourth bump pads PB1 to PB4. The first to fourth bump pads PB1 to PB4 may be realized to have a size of several tens of micrometers (μm). For example, the first to fourth bump pads PB1 to PB4 may have such a small size that they can be hardly probed with probe pins which are used in test of the semiconductor device.

A connection relationship between the third to sixth wiring resistors RLD3 to RDL6 and the first to fourth bump pads PB1 to PB4 will be described in more hereinafter.

The third wiring resistor RDL3 may have the first resistance value R1. One terminal of the third wiring resistor RDL3 may be coupled to the third pad P3 through the third wire W3, and the other terminal of the third wiring resistor RDL3 may be coupled to the first bump pad PB1.

The first bump pad PB1 may be coupled to the external resistor RZQ.

The fourth wiring resistor RDL4 may have the first resistance value R1. One terminal of the fourth wiring resistor RDL4 may be coupled to the fourth pad P4 through the fourth wire W4, and the other terminal of the fourth wiring resistor RDL4 may be coupled to the second bump pad PB2.

The fifth wiring resistor RDL5 may have the first resistance value R1. One terminal of the fifth wiring resistor RDL5 may be coupled to the fifth pad P5 through the fifth wire W5, and the other terminal of the fifth wiring resistor RDL5 may be coupled to the third bump pad PB3.

The sixth wiring resistor RDL6 may have the first resistance value R1. One terminal of the sixth wiring resistor RDL6 may be coupled to the sixth pad P6 through the sixth wire W6, and the other terminal of the sixth wiring resistor RDL6 may be coupled to the fourth bump pad PB4.

The resistance value between the third pad P3 and a ground terminal may correspond to a sum of resistance values of the third wiring resistor RDL3 and the external resistor RZQ.

For example, in an embodiment, the resistance value of the external resistor RZQ may be set to 240Ω. The resistance value of the external resistor RZQ may be set differently in accordance with resistance values of external wires of the semiconductor device.

For example, the data reception circuit 20 may include the resistor coupling circuit 21 having the second resistance value R2 by the first and second wiring resistors RDL1 and RDL2 which are coupled in series between the first pad P1 and the second pad P2 and may further include the external resistor RZQ coupled to the third wiring resistor RDL3 that is coupled to the third pad P3 to have the first resistance value R1. The data reception circuit 20 may receive data through the fourth to sixth wiring resistors RDL4 to RDL6.

The first to sixth wiring resistors RDL1 to RDL6 may be realized using redistributed interconnection lines which are connected to pads that are disposed to readily package the semiconductor devices 1, 2 and 3 which are stacked. The resistance values of the first to sixth wiring resistors RDL1 to RDL6 may be set to the first resistance value R1. The resistance values of the first to sixth wiring resistors RDL1 to RDL6 may be set differently in accordance with the embodiments.

The first to fourth bump pads PB1 to PB4 of the first semiconductor device 1 may be coupled to the second semiconductor device 2 and the third semiconductor device 3 through via electrodes TSV1 and TSV2.

The second semiconductor device 2 may be realized to have the same configuration or substantially the same configuration as the first semiconductor device 1, and an operation of the second semiconductor device 2 may be substantially the same as an operation of the first semiconductor device 1. Thus, a description of the second semiconductor device 2 will be omitted hereinafter.

The third semiconductor device 3 may be a controller or a test device for controlling operations of the first semiconductor device 1 and the second semiconductor device 2. The third semiconductor device 3 may include solder balls SB and may be coupled to another external device through the solder balls SB.

The integrated circuit according to an embodiment may be realized to have a system-in-package (SIP) form in which the first to third semiconductor devices 1 to 3 are encapsulated, and the number of semiconductor devices included in the integrated circuit may be set differently in accordance with the embodiments.

Figure 2:
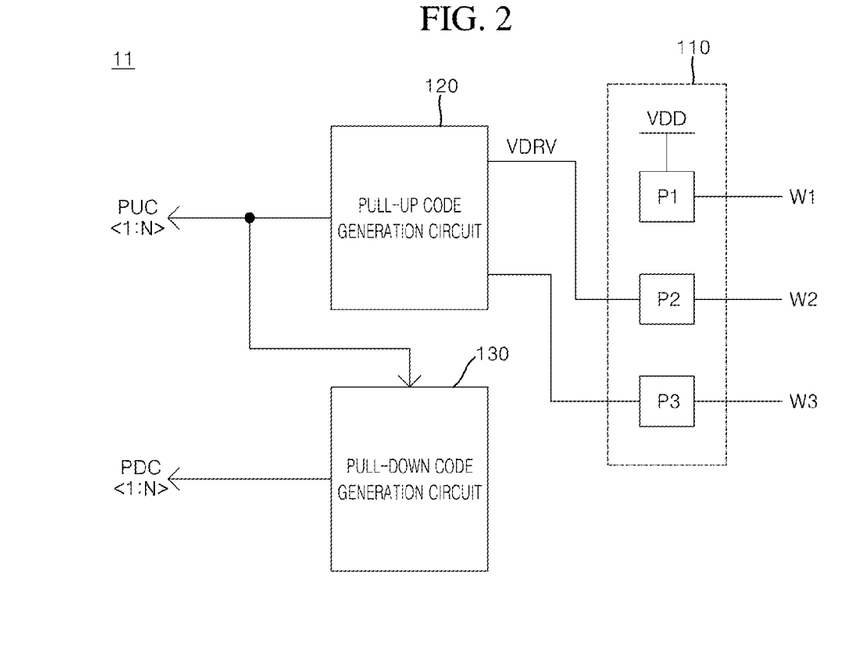
FIG. 2 is a block diagram illustrating a representation of an example of a configuration of a calibration circuit included in the integrated circuit of FIG. 1.

Referring to FIG. 2, the calibration circuit 11 may include a pad section 110, a pull-up code generation circuit 120, and a pull-down code generation circuit 130.

The pad section 110 may include the first to third pads P1 to P3.

The first pad P1 may receive a power supply voltage VDD and may be coupled to the first wire W1.

The second pad P2 may be coupled to the second wire W2 and may receive a drive voltage VDRV. The drive voltage VDRV may be a voltage that remains after subtracting a voltage drop across the first and second wiring resistors RDL1 and RDL2 from the power supply voltage VDD.

The third pad P3 may be coupled to the third wire W3.

The pull-up code generation circuit 120 may receive the drive voltage VDRV from the second pad P2 to generate the pull-up code PUC<1:N> in accordance with the resistance value between the third pad P3 and the ground terminal.

The pull-down code generation circuit 130 may generate the pull-down code PDC<1:N> in accordance with a resistance value which is set by the pull-up code PUC<1:N>.

For example, the calibration circuit 11 may perform an impedance calibration operation in accordance with the resistance value between the third pad P3 and the ground terminal to generate the pull-up code PUC<1:N> and the pull-down code PDC<1:N>.

Figure 3:
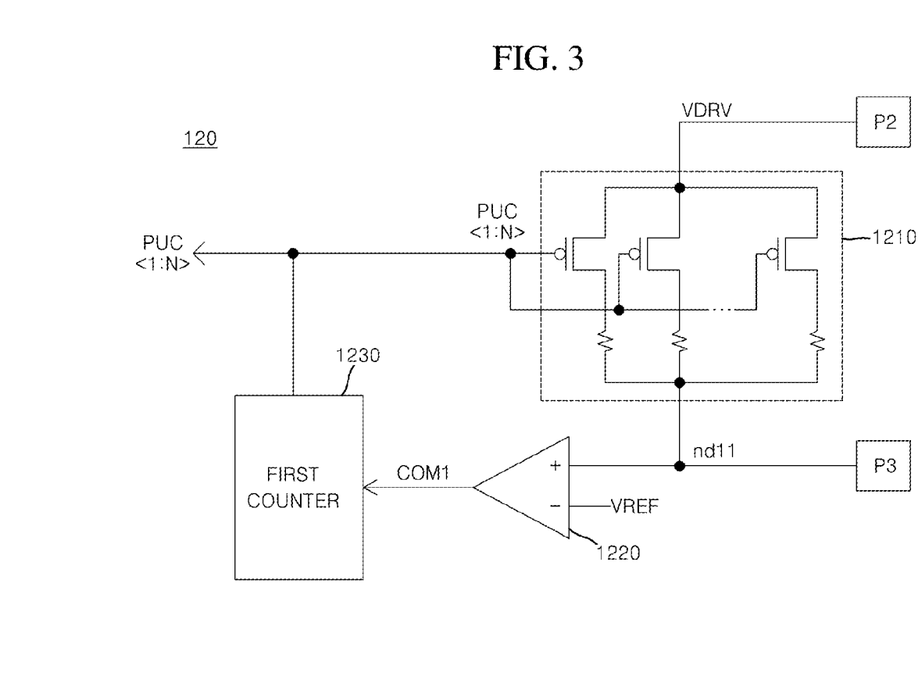
FIG. 3 is a block diagram illustrating a representation of an example of a configuration of a pull-up code generation circuit included in the calibration circuit of FIG. 2.

Referring to FIG. 3, the pull-up code generation circuit 120 may include a first drive circuit 1210, a first comparator 1220, and a first counter 1230.

The first drive circuit 1210 may be coupled between the second pad P2 and the third pad P3. The first drive circuit 1210 may receive the drive voltage VDRV from the second pad P2, and a resistance value of the first drive circuit 1210 may be adjusted by the pull-up code PUC<1:N>. The second pad P2 may be coupled to the first pad P1 through the first and second wiring resistors RDL1 and RDL2 (see FIG. 1).

The first comparator 1220 may compare a voltage of a node nd11 coupled to the third pad P3 with a reference voltage VREF to generate a first comparison signal COM1. The first comparison signal COM1 may be set to be enabled if a voltage of the node nd11 is lower than the reference voltage VREF. For example, the first comparator 1220 may generate the first comparison signal COM1 having a logic high level if the voltage of the node nd11 is greater than the reference voltage VREF and may generate the first comparison signal COM1 having a logic low level if the voltage of the node nd11 is less than the reference voltage VREF. The logic level of the first comparison signal COM1 which is generated in accordance with a comparison result of the voltage of the node nd11 and the reference voltage VREF may be set differently in accordance with the embodiments.

The first counter 1230 may output the pull-up code PUC<1:N> that is counted in response to the first comparison signal COM1. The first counter 1230 may count up or count down the pull-up code PUC<1:N> in accordance with a logic level of the first comparison signal COM1.

For example, the pull-up code generation circuit 120 may perform an impedance calibration operation for counting the pull-up code PUC<1:N> until a resistance value between the first pad P1 and the third pad P3 is equal to the resistance value between the third pad P3 and the ground terminal.

Figure 4:
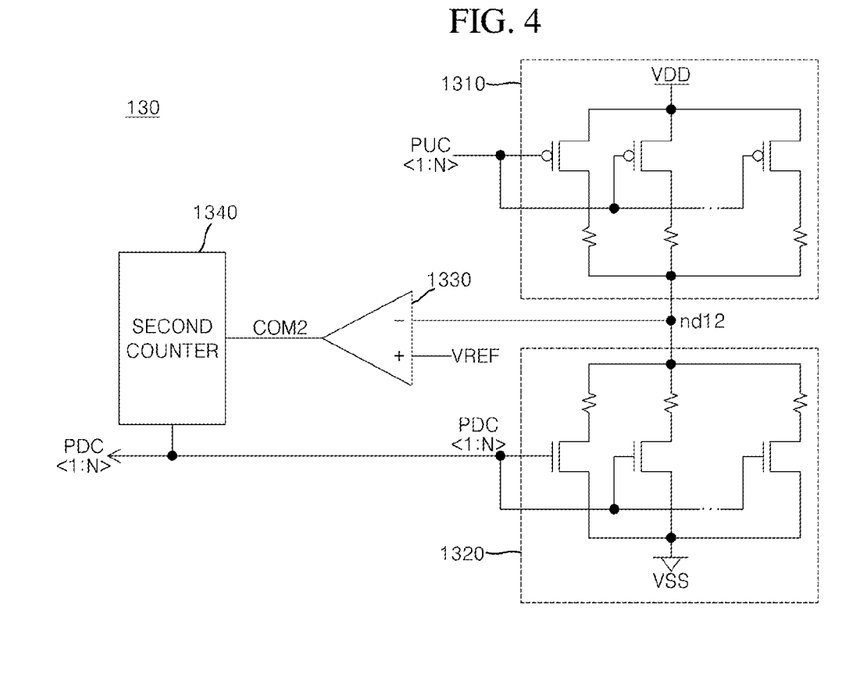
FIG. 4 is a block diagram illustrating a representation of an example of a configuration of a pull-down code generation circuit included in the calibration circuit of FIG. 2.

Referring to FIG. 4, the pull-down code generation circuit 130 may include a second drive circuit 1310, a third drive circuit 1320, a second comparator 1330, and a second counter 1340.

The second drive circuit 1310 may be coupled between a power supply voltage VDD terminal and a node nd12, and a resistance value of the second drive circuit 1310 may be set by the pull-up code PUC<1:N>. For example, the resistance value of the second drive circuit 1310 may be set by the pull-up code PUC<1:N>, like the first drive circuit 1210 illustrated in FIG. 3.

The third drive circuit 1320 may be coupled between the node nd12 and a ground voltage VSS terminal, and a resistance value of the third drive circuit 1320 may be adjusted according to the pull-down code PDC<1:N>.

The second comparator 1330 may compare a voltage of the node nd12 with the reference voltage VREF to generate a second comparison signal COM2. The second comparison signal COM2 may be set to be enabled if the voltage of the node nd12 is greater than the reference voltage VREF. For example, the second comparator 1330 may generate the second comparison signal COM2 having a logic low level if the voltage of the node nd12 is greater than the reference voltage VREF and may generate the second comparison signal COM2 having a logic high level if the voltage of the node nd12 is less than the reference voltage VREF. The logic level of the second comparison signal COM2 which is generated in accordance with a comparison result of the voltage of the node nd12 and the reference voltage VREF may be set differently in accordance with the embodiments.

The second counter 1340 may output the pull-down code PDC<1:N> that is counted in response to the second comparison signal COM2. The second counter 1340 may count up or count down the pull-down code PDC<1:N> in accordance with the logic level of the second comparison signal COM2.

The resistance value of the third drive circuit 1320 may be set to be the same as the resistance value of the first drive circuit 1210 illustrated in FIG. 3 and the resistance value of the second drive circuit 1310.

For example, the pull-down code generation circuit 130 may perform an impedance calibration operation for counting the pull-down code PDC<1:N> until the resistance value of the third drive circuit 1320 is equal to a resistance value of the second drive circuit 1310 which is set by the pull-up code PUC<1:N>.

Figure 5:
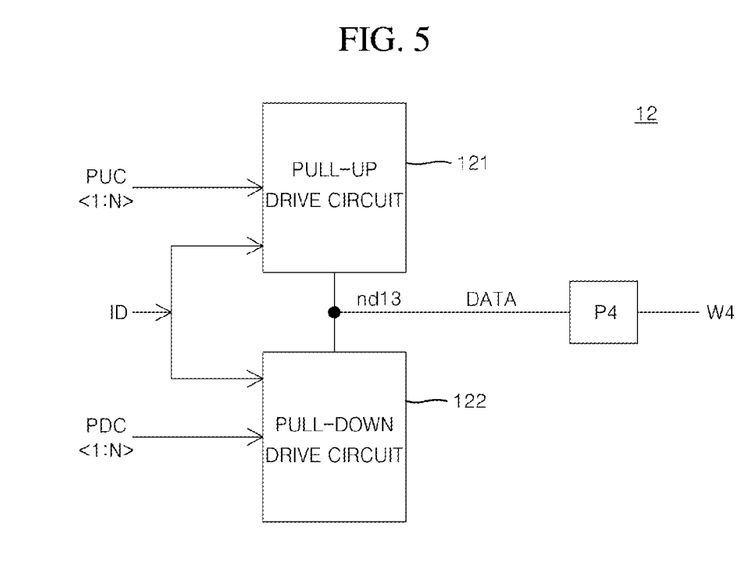
FIG. 5 is a block diagram illustrating a representation of an example of a configuration of a data output circuit included in the integrated circuit of FIG. 1.

Referring to FIG. 5, the data output circuit 12 may include a pull-up drive circuit 121 and a pull-down drive circuit 122.

The pull-up drive circuit 121 may drive a node nd13 through which data DATA is outputted, with a drivability which is adjusted by the pull-up code PUC<1:N> in response to internal data ID.

The pull-down drive circuit 122 may drive the node nd13 through which the data DATA is outputted, with a drivability which is adjusted by the pull-down code PDC<1:N> in response to the internal data ID.

For example, the data output circuit 12 may drive the node nd13 through which the data DATA is outputted, with a drivability which is adjusted by the pull-up code PUC<1:N> and the pull-down code PDC<1:N> in response to the internal data ID and may output the data DATA through the fourth pad P4.

The data output circuit 12 is illustrated as one circuit which outputs the data DATA through the fourth pad P4, but the present disclosure is not limited thereto. For example, in some embodiments, the data output circuit 12 may be realized using a plurality of circuits which output data through a plurality of pads.

An operation of the integrated circuit having an aforementioned configuration will be described hereinafter with reference to FIG. 1 to FIG. 5 in conjunction with an example in which the data are outputted by performing an impedance calibration operation using the wiring resistor coupled to the external resistor as a reference resistor.

The pull-up code generation circuit 120 of the calibration circuit 11 may receive the drive voltage VDRV from the second pad P2 and may perform the impedance calibration operation in accordance with a resistance value between the third pad P3 and the ground terminal to generate the pull-up code PUC<1:N>.

During the impedance calibration operation, a voltage level of the third pad P3 may be driven to a mid-level of the power supply voltage VDD. The resistance value between the third pad P3 and the ground terminal may correspond to a sum of the resistance values of the third wiring resistor RDL3 and the external resistor RZQ. The second pad P2 may be coupled to the first pad P1 through the resistor coupling circuit 21.

The pull-up code generation circuit 120 may generate the pull-up code PUC<1:N> so that a resistance value between the first pad P1 and the third pad P3 (i.e., the node nd11) is equal to the resistance value between the third pad P3 and the ground terminal. For example, the pull-up code PUC<1:N> has to be set so that a sum of the second resistance value R2 of the resistor coupling circuit 21 between the first and second pads P1 and P2 and a resistance value of the first drive circuit 1210 is equal to the resistance value between the third pad P3 and the ground terminal. Thus, the first drive circuit 1210 may have a resistance value that remains after subtracting the first resistance value R1 from a resistance value of the external resistor RZQ.

The pull-down code generation circuit 130 may perform the impedance calibration operation in accordance with a resistance value of the second drive circuit 1310 set by the pull-up code PUC<1:N>, thereby generating the pull-down code PDC<1:N>. At this time, a resistance value of the third drive circuit 1320 which is set by the pull-down code PDC<1:N> may be equal to the resistance value of the first drive circuit 1210. For example, the pull-down code generation circuit 130 may have a resistance value which is less than that of the external resistor RZQ by the first resistance value R1.

The data output circuit 12 may receive the pull-up code PUC<1:N> to operate so that the pull-up drive circuit 121 has a resistance value which is less than that of the external resistor RZQ by the first resistance value R1. The data output circuit 12 may receive the pull-down code PDC<1:N> to operate so that the pull-down drive circuit 122 has a resistance value which is less than that of the external resistor RZQ by the first resistance value R1.

For example, a resistance value of the data output circuit 12 may be set to be less than that of the external resistor RZQ by the first resistance value R1. The data output circuit 12 may output the data DATA through the fourth pad P4. The resistance value less than that of the external resistor RZQ by the first resistance value R1 means a drivability of the data output circuit 12 for driving the fourth pad P4.

The fourth wiring resistor RDL4 of the bump pad coupling circuit 22 may receive the data DATA to output the data DATA through the second bump pad PB2.

For example, a resistance value measured at the fourth pad P4 when the data DATA are outputted through the second bump pad PB2 may correspond to a sum of the resistance value of the data output circuit 12 and the resistance value of the fourth wiring resistor RDL4.

For example, resistance value of the data output circuit 12 may be set to a resistance value less than that of the external resistor RZQ by the first resistance value R1, and the resistance value of the fourth wiring resistor RDL4 may be the first resistance value R1. Accordingly, the data DATA may be outputted by a drivability corresponding to the resistance value of the external resistor RZQ.

The integrated circuit having an aforementioned configuration may perform the impedance calibration operation in accordance with the resistance values of the internal wiring resistor and the external resistor to output the data, thereby preventing a data error which is recognized by an external device. In addition, it is possible to prevent data from being reflected through an external wire.

Figure 6:
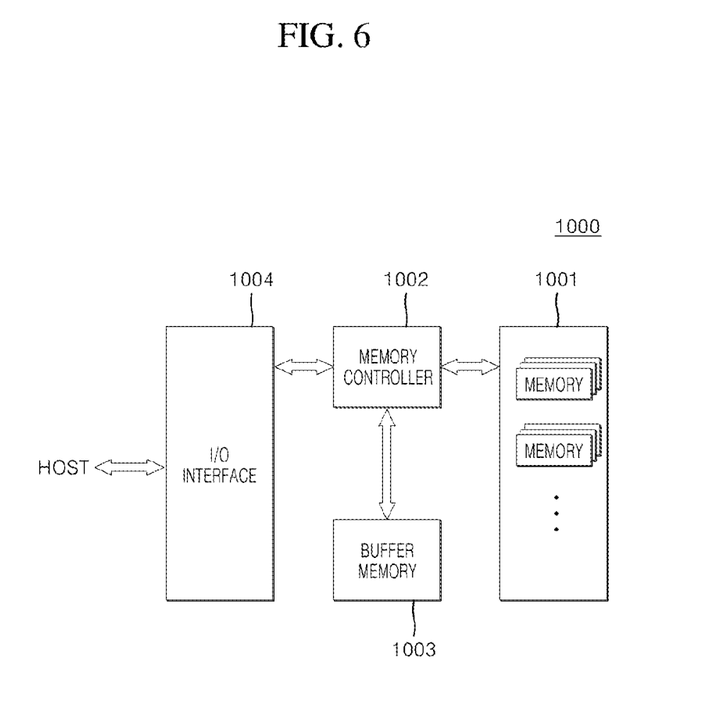
FIG. 6 is a block diagram illustrating a representation of an example of a configuration of an electronic system employing the semiconductor device or the semiconductor system illustrated in FIGS. 1 to 5.

At least one of the semiconductor devices or at least one of the semiconductor systems described with reference to FIGS. 1 to 5 may be applied to an electronic system that includes a memory system, a graphic system, a computing system, a mobile system, or the like. For example, an electronic system 1000 according an embodiment may include data storage 1001, a memory controller 1002, a buffer memory 1003, and an input/output (I/O) interface 1004, as illustrated in FIG. 6.

The data storage 1001 may store data which are outputted from the memory controller 1002 or may read and output the stored data to the memory controller 1002, according to a control signal generated from the memory controller 1002. The data storage 1001 may include the first semiconductor device 1 and the second semiconductor device 2 which are illustrated in FIG. 1. The data storage 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage 1001 or the buffer memory 1003 or for outputting the data stored in the data storage 1001 or the buffer memory 1003. The memory controller 1002 may include the third semiconductor device 3 illustrated in FIG. 1. Although FIG. 6 illustrates the memory controller 1002 with a single block, the memory controller 1002 may include one controller for controlling the data storage 1001 comprised of a nonvolatile memory and another controller for controlling the buffer memory 1003 comprised of a volatile memory.

The buffer memory 1003 may temporarily store the data which are processed by the memory controller 1002. For example, the buffer memory 1003 may temporarily store the data which are outputted from or to be inputted to the data storage 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. For example, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. An integrated circuit comprising:
   a data transmission circuit suitable for including first, second, and third pads, suitable for generating a pull-up code and a pull-down code in accordance with a resistance value between the third pad and a ground terminal, and suitable for driving data with drivability adjustable by the pull-up code and the pull-down code to output the data; and
   a data reception circuit suitable for including a resistor coupling circuit coupled between the first pad and the second pad and configured to include a second resistance value, including an external resistor coupled to the third pad through a first wiring resistor having a first resistance value, and suitable for receiving the data through a second wiring resistor.

2. The circuit of claim 1, wherein the second resistance value is twice the first resistance value.

3. The circuit of claim 1, wherein a resistance value of the third pad and the ground terminal corresponds to a sum of the first resistance value and a resistance value of the external resistor.

4. The circuit of claim 1,
   wherein the resistor coupling circuit includes wiring resistors coupled in series; and
   wherein each of the wiring resistors has the same resistance value as the first wiring resistor.

5. The circuit of claim 1, wherein the resistor coupling circuit includes:
   a third wiring resistor coupled to the first pad to have the first resistance value; and
   a fourth wiring resistor coupled between the third wiring resistor and the second pad to have the first resistance value.

6. The circuit of claim 1,
   wherein the data reception circuit further includes a bump pad coupling circuit; and
   wherein the bump pad coupling circuit includes a first bump pad coupled between the first wiring resistor and the external resistor and a second bump pad coupled to the second wiring resistor.

7. The circuit of claim 1, wherein the data transmission circuit includes:
   a calibration circuit suitable for performing an impedance calibration operation in accordance with the resistance value between the third pad and the ground terminal to generate the pull-up code and the pull-down code; and
   a data output circuit suitable for driving the data with a drivability adjusted by the pull-up code and the pull-down code to output the data through a fourth pad.

8. The circuit of claim 7, wherein the calibration circuit includes:
   a pull-up code generation circuit suitable for receiving a drive voltage from the second pad to output the pull-up code counted in accordance with the resistance value between the third pad and the ground terminal; and
   a pull-down code generation circuit suitable for outputting the pull-down code counted in accordance with a resistance value set by the pull-up code.

9. The circuit of claim 8,
   wherein the first pad is coupled to a power supply voltage terminal and is coupled to a third wiring resistor;
   wherein the second pad is coupled to a fourth wiring resistor coupled in series to the third wiring resistor to apply the drive voltage to the pull-up code generation circuit; and
   wherein the third pad is coupled to the first wiring resistor.

10. The circuit of claim 8, wherein the pull-up code generation circuit includes:
    a first drive circuit coupled between the second pad and the third pad to pull up a first node coupled to the third pad according to the pull-up code;
    a first comparator suitable for comparing a voltage of the first node with a reference voltage to generate a first comparison signal; and
    a first counter suitable for outputting the pull-up code counted in response to the first comparison signal.

11. The circuit of claim 8, wherein the pull-down code generation circuit includes:
    a second drive circuit suitable for pulling up a second node in accordance with the pull-up code;
    a third drive circuit coupled between the second node and the ground terminal to pull down the second node in accordance with the pull-down code;
    a second comparator suitable for comparing a voltage of the second node with a reference voltage to generate a second comparison signal; and
    a second counter suitable for outputting the pull-down code counted in response to the second comparison signal.

12. The circuit of claim 7, wherein the data output circuit includes:
    a pull-up drive circuit suitable for pulling up a third node through which the data is outputted, with a drivability adjusted by the pull-up code in response to internal data; and
    a pull-down drive circuit suitable for pulling down the third node with a drivability adjusted by the pull-down code in response to the internal data.

13. A semiconductor device comprising:
    a calibration circuit suitable for including first to third pads and suitable for performing an impedance calibration operation in accordance with a resistance value between the third pad coupled to an external resistor and a ground terminal to generate a pull-up code and a pull-down code;
    a resistor coupling circuit coupled between the first pad and the second pad and configured to include a second resistance value; and
    a data output circuit suitable for driving data with a drivability adjusted by the pull-up code and the pull-down code to output the data through a first wiring resistor having a first resistance value.

14. The device of claim 13, wherein the second resistance value is twice the first resistance value.

15. The device of claim 13, wherein a resistance value of the third pad and the ground terminal corresponds to a sum of the first resistance value and a resistance value of the external resistor.

16. The device of claim 13,
wherein the resistor coupling circuit includes wiring resistors coupled in series; and
wherein each of the wiring resistors has the same resistance value as the first wiring resistor.

17. The device of claim 13, wherein the resistor coupling circuit includes:
a second wiring resistor coupled to the first pad to have the first resistance value; and
a third wiring resistor coupled between the second wiring resistor and the second pad to have the first resistance value.

18. The device of claim 13, further comprising bump pad coupling circuit,
wherein the bump pad coupling circuit includes:
a first bump pad coupled between a fourth wiring resistor connected to the third pad and the external resistor; and
a second bump pad coupled to the first wiring resistor.

19. The device of claim 13, wherein the calibration circuit includes:
a pad section including the first to third pads;
a pull-up code generation circuit suitable for receiving a drive voltage from the second pad to output the pull-up code counted in accordance with the resistance value between the third pad and the ground terminal; and
a pull-down code generation circuit suitable for outputting the pull-down code counted in accordance with a resistance value set by the pull-up code.

20. The device of claim 19, wherein the pad section includes:
wherein the first pad is coupled to a power supply voltage terminal and is coupled to a second wiring resistor;
wherein the second pad is coupled to a third wiring resistor coupled in series to the second wiring resistor to apply the drive voltage to the pull-up code generation circuit; and
wherein the third pad is coupled to a fourth wiring resistor having the second resistance value.

21. The device of claim 19, wherein the pull-up code generation circuit includes:
a first drive circuit coupled between the second pad and the third pad to pull up a first node coupled to the third pad according to the pull-up code;
a first comparator suitable for comparing a voltage of the first node with a reference voltage to generate a first comparison signal; and
a first counter suitable for outputting the pull-up code counted in response to the first comparison signal.

22. The device of claim 19, wherein the pull-down code generation circuit includes:
a second drive circuit suitable for pulling up a second node in accordance with the pull-up code;
a third drive circuit coupled between the second node and the ground terminal to pull down the second node in accordance with the pull-down code;
a second comparator suitable for comparing a voltage of the second node with a reference voltage to generate a second comparison signal; and
a second counter suitable for outputting the pull-down code counted in response to the second comparison signal.

23. The device of claim 13, wherein the data output circuit includes:
a pull-up drive circuit suitable for pulling up a third node through which the data is outputted, with a drivability adjusted by the pull-up code in response to internal data; and
a pull-down drive circuit suitable for pulling down the third node with a drivability adjusted by the pull-down code in response to the internal data.

24. A semiconductor device comprising:
a calibration circuit including a first pad, a second and a third pad and configured to perform an impedance calibration operation in accordance with a resistance value between the third pad coupled to an external resistor and a ground terminal;
a resistor coupling circuit coupled between the first and second pad and configured to provide a first resistance value; and
a data output circuit coupled to the calibration circuit and configured to output data, drive the data, and adjust driving the data in accordance with a resistance value of the external resistor.

25. The device of claim 24, wherein the data output circuit is configured to output the data through a first wiring resistor having a second resistance value.

26. The device of claim 25, wherein the first resistance value is set to be twice the second resistance value.

27. The device of claim 24,
wherein the calibration circuit performs the impedance calibration operation in accordance with the resistance value between the third pad coupled to the external resistor and the ground terminal to generate code, and
wherein the data output circuit is configured to drive the data with the drivability adjusted by the code.

28. The device of claim 25, wherein a resistance value of the third pad and the ground terminal is set to correspond to a sum of the second resistance value and the resistance value of the external resistor.

29. The device of claim 25,
wherein the resistor coupling circuit includes wiring resistors coupled in series; and
wherein each of the wiring resistors has the same resistance value as the first wiring resistor.

30. The device of claim 25, wherein the resistor coupling circuit includes:
a second wiring resistor coupled to the first pad to have the second resistance value; and
a third wiring resistor coupled between the second wiring resistor and the second pad to have the second resistance value.

* * * * *